US009005706B2

(12) United States Patent
Stout et al.

(10) Patent No.: US 9,005,706 B2
(45) Date of Patent: *Apr. 14, 2015

(54) METHOD FOR MASKING AND COATING CUTTING TOOL AND CUTTING TOOL HAVING WEAR-RESISTANT COATING IN SELECTED LOCATIONS

(71) Applicant: American Axle & Manufacturing, Inc., Detroit, MI (US)

(72) Inventors: Gregory L. Stout, Attica, MI (US); Miguel Morfin Diaz, Irapuato (MX); Mauro De Donno, Troy, MI (US)

(73) Assignee: American Axle & Manufacturing, Inc., Detroit, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/332,591

(22) Filed: Jul. 16, 2014

(65) Prior Publication Data
US 2014/0328637 A1 Nov. 6, 2014

Related U.S. Application Data

(63) Continuation of application No. 14/192,055, filed on Feb. 27, 2014, which is a continuation of application No. 11/580,184, filed on Oct. 12, 2006, now Pat. No. 8,703,240.

(60) Provisional application No. 60/727,755, filed on Oct. 18, 2005.

(51) Int. Cl.
C23C 26/00 (2006.01)
B23F 21/12 (2006.01)
C23C 14/04 (2006.01)
C23C 16/04 (2006.01)
C23C 30/00 (2006.01)
B23P 6/00 (2006.01)
B23F 21/00 (2006.01)

(52) U.S. Cl.
CPC .............. *C23C 26/00* (2013.01); *Y10T 407/27* (2015.01); *Y10T 29/49746* (2015.01); *B23B 2228/10* (2013.01); *B23F 21/126* (2013.01); *C23C 14/042* (2013.01); *C23C 16/042* (2013.01); *C23C 30/005* (2013.01); *B23P 6/00* (2013.01); *B23F 21/00* (2013.01)

(58) Field of Classification Search
None
See application file for complete search history.

(56) References Cited

U.S. PATENT DOCUMENTS

| 3,356,599 A | * | 12/1967 | Weiss | 205/110 |
| 4,597,695 A | * | 7/1986 | Johnson | 407/113 |
| 4,653,373 A | | 3/1987 | Gerber | |
| 6,330,750 B1 | * | 12/2001 | Meckel | 30/350 |
| 6,605,160 B2 | | 8/2003 | Hoskin | |
| 7,147,939 B2 | | 12/2006 | Henderer et al. | |

OTHER PUBLICATIONS

"Cutting Tools," Machinery's Handbook, 24th Edition, Third Printing, by Erik Oberg, Franklin D. Jones, Holbrook L. Horton and Henry H. Ryffel, pp. 683-690. Copyright 1988, 1992 by Industrial Press Inc.

* cited by examiner

*Primary Examiner* — Alex A Rolland
(74) *Attorney, Agent, or Firm* — Harness, Dickey & Pierce, P.L.C.

(57) ABSTRACT

A method in which a cutting tip of an intermediate cutting tool is masked and a wear-resistant material is deposited onto the exposed portion of the intermediate cutting tool to form a sharpened cutting tool. A finished cutting tool is also provided.

15 Claims, 4 Drawing Sheets

METHOD FOR MASKING AND COATING CUTTING TOOL AND CUTTING TOOL HAVING WEAR-RESISTANT COATING IN SELECTED LOCATIONS

CROSS-REFERENCE TO RELATED APPLICATIONS

This application is a continuation of U.S. patent application Ser. No. 14/192,055 filed Feb. 27, 2014, which is a continuation of U.S. patent application Ser. No. 11/580,184 filed on Oct. 12, 2006, now U.S. Pat. No. 8,703,240 which claims the benefit of U.S. Provisional Application No. 60/727,755 filed on Oct. 18, 2005. The entire disclosure of each of the above applications is incorporated herein by reference as if fully set forth in detail herein.

FIELD

The present disclosure relates to a method for forming workpieces using tool blades that are coated in a process that uses masking to partly cover the tool blades.

BACKGROUND

This section provides background information related to the present disclosure which is not necessarily prior art.

Many vehicle drivelines include power transmission devices having a number of gears in meshing engagement with one another. Each gear typically includes a plurality of teeth spaced apart from one another to properly mesh with the teeth of another gear. Each gear tooth must be precisely formed to provide reliable power transmission over an extended period of time.

The gears are constructed using gear cutting tools operable to remove material from a gear blank to define the gear teeth. In high volume manufacturing, it is desirable to quickly and accurately cut the gear teeth into a desired finished shape. It is also desirable to minimize the costs associated with constructing such gears. Accordingly, tooling design engineers strive to define manufacturing processes where not only the finished gear is constructed according to specification but where the cutting tools remain sharp for extended periods of time. A number of cutting tool manufacturers have constructed cutting tools from high speed steel, tungsten carbide and other cutting materials. In one instance, tool life has been extended by coating a tungsten carbide tool with a wear resistant material such as titanium aluminum nitride. Titanium nitride may be used as a coating for high speed steel applications. The coating is typically applied by immersing the tool in an environment containing a mixture of gas including titanium aluminum nitride or titanium nitride for six to eight hours. During exposure to the gas mixture, a coating is deposited on all surfaces exposed to this environment. Cutting tools exposed to this process have exhibited up to double the cutting life of similar tools not coated with the wear resistant material.

Once a cutting tool has become dull, it is common practice to grind the tip of the cutting tool to sharpen and/or redefine the cutting edge or edges. Unfortunately, the grinding process removes the coating previously applied to the cutting surfaces. Typically, the entire tool is exposed to the coating process once again to assure that the recently ground surfaces are coated. Because not all of the cutting tool is ground during the sharpening process, most of the cutting tool receives an additional coating thickness of the wear resistant material. It has been found that this grinding and recoating process may be repeated approximately five times until an undesirable result occurs. Specifically, once five or more layers of the coating are accumulated on the non-ground surfaces, the coating no longer properly adheres and causes the tool to fail.

It has been contemplated to remove the coating from the entire cutting tool prior to recoating using a chemical process. The chemical process negatively affects the cutting tool by removing the Cobalt from the cutting tool surface. The carbide microstructure is adversely altered and no longer exhibits the excellent cutting properties for which the tool is designed.

Alternately, it has been contemplated to machine more surfaces of the cutting tool to remove the previous coatings prior to reapplying another coating to the reground cutter. Unfortunately, the additional machining processes are very costly and may negatively interfere with the geometry of the cutting tool and repeatability of the machining operation. Accordingly, a need exists for a method of sharpening and recoating a cutting tool to extend the interval between cutting tool sharpening operations and to increase the number of times a given tool may be sharpened.

SUMMARY

This section provides a general summary of the disclosure, and is not a comprehensive disclosure of its full scope or all of its features.

In one form, the present teachings provide a method for forming a sharpened cutting tool. The method includes: grinding a cutting tip to form an intermediate cutting tool, the cutting tip of the intermediate cutting tool comprising a planar face and a sharpened cutting edge at a distal end of the planar face, the cutting tip being relieved on a side and an end that cooperate with the planar face to define the sharpened cutting edge; masking the intermediate cutting tool such that a first predetermined portion of the planar face is exposed and a second predetermined portion of the planar face is not exposed, the exposed portion of the planar face including the sharpened cutting edge and including at least portions of the end and the side that cooperate to define the cutting edge; and depositing a wear-resistant material onto the exposed portion of the planar face of the intermediate cutting tool to form the sharpened cutting tool.

In another form, the present teachings provide a method for forming a sharpened cutting tool. The method includes: grinding a cutting tip to form an intermediate cutting tool, the cutting tip of the intermediate cutting tool comprising a planar face and a sharpened cutting edge at a distal end of the planar face, the cutting tip being relieved on a side and an end that cooperate with the planar face to define the sharpened cutting edge; masking the intermediate cutting tool such that a first predetermined portion of the planar face is exposed and a second predetermined portion of the planar face is not exposed, the second predetermined portion being spaced apart from the sharpened cutting edge; and depositing a wear-resistant material onto the first predetermined portion of the cutting tip of the intermediate cutting tool to form the sharpened cutting tool, the wear-resistant material not being deposited on the second predetermined portion of the cutting tip of the intermediate cutting tool.

In yet another form, the present teachings provide a method that includes: grinding a cutting tip to form an intermediate cutting tool, the cutting tip of the intermediate cutting tool comprising a planar face and a sharpened cutting edge at a distal end of the planar face, the cutting tip being relieved on a side and an end that cooperate with the planar face to define the sharpened cutting edge; masking the intermediate cutting tool such that a first predetermined portion of the planar face is exposed and a second predetermined portion of the planar face is not exposed, the exposed portion of the planar face including the sharpened cutting edge and including at least portions of the end and the side that cooperate to define the cutting edge; depositing a wear-resistant material onto the exposed portion of the planar face of the intermediate cutting tool to form a sharpened cutting tool; and forming a workpiece, the workpiece being cut with the sharpened cutting tool.

In still another form, the present teachings provide a method that includes: grinding a cutting tip to form an intermediate cutting tool, the cutting tip of the intermediate cutting tool comprising a planar face and a sharpened cutting edge at a distal end of the planar face, the cutting tip being relieved on a side and an end that cooperate with the planar face to define the sharpened cutting edge; masking the intermediate cutting tool such that a first predetermined portion of the planar face is exposed and a second predetermined portion of the planar face is not exposed, the second predetermined portion being spaced apart from the sharpened cutting edge; depositing a wear-resistant material onto the first predetermined portion of the cutting tip of the intermediate cutting tool to form the sharpened cutting tool, the wear-resistant material not being deposited on the second predetermined portion of the cutting tip of the intermediate cutting tool; and cutting a workpiece with the sharpened cutting tool.

In still another form, the present teachings provide a method for forming a sharpened cutting tool from an intermediate cutting tool. The intermediate cutting tool has a ground cutting tip that includes a planar face and a sharpened cutting edge at a distal end of the planar face. The ground cutting tip is relieved on a side and an end that cooperate with the planar face to define the sharpened cutting edge. The method includes: masking the intermediate cutting tool such that a first predetermined portion of the planar face is exposed and a second predetermined portion of the planar face is not exposed, the exposed portion of the planar face including the sharpened cutting edge and including at least portions of the end and the side that cooperate to define the cutting edge; and depositing a wear-resistant material onto the exposed portion of the planar face of the intermediate cutting tool to form the sharpened cutting tool.

In yet another form, the present teachings provide a method for forming a sharpened cutting tool from an intermediate cutting tool. The intermediate cutting tool has a ground cutting tip that includes a planar face and a sharpened cutting edge at a distal end of the planar face. The ground cutting tip is relieved on a side and an end that cooperate with the planar face to define the sharpened cutting edge. The method includes: masking the intermediate cutting tool such that a first predetermined portion of the planar face is exposed and a second predetermined portion of the planar face is not exposed, the second predetermined portion being spaced apart from the sharpened cutting edge; and depositing a wear-resistant material onto the first predetermined portion of the cutting tip of the intermediate cutting tool to form the sharpened cutting tool, the wear-resistant material not being deposited on the second predetermined portion of the cutting tip of the intermediate cutting tool.

In another form, the present teachings provide a method for forming a sharpened cutting tool from an intermediate cutting tool. The intermediate cutting tool has a sharpened cutting edge that is defined by a planar face, a side face and an end face. The sharpened cutting tool includes a right parallelepiped body and a cutting tip that includes the sharpened cutting edge and a wear-resistant coating deposited thereon. The method includes: masking the intermediate cutting tool such that a first predetermined portion of the planar face is exposed and a second predetermined portion of the planar face is not exposed, the second predetermined portion of the planar face being spaced apart from the sharpened cutting edge; and depositing a wear-resistant material onto the exposed portion of the planar face of the intermediate cutting tool to form the sharpened cutting tool such that the wear-resistant material is disposed between the sharpened cutting edge and an unexposed portion of the planar face, the wear-resistant material being selected from a group consisting of titanium aluminum nitride, titanium nitride and combinations thereof.

In still another form, the present teaching provide a finished cutting tool that includes a right parallelepiped body and a cutting tip. The cutting tip includes a sharpened cutting edge and a wear-resistant coating. The sharpened cutting edge is defined by a planar face, a side face and an end face. The wear-resistant coating is deposited on a predetermined first portion of the planar face and is not deposited on a predetermined second portion of the planar face. The predetermined second portion of the planar face is spaced apart from the sharpened cutting edge.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
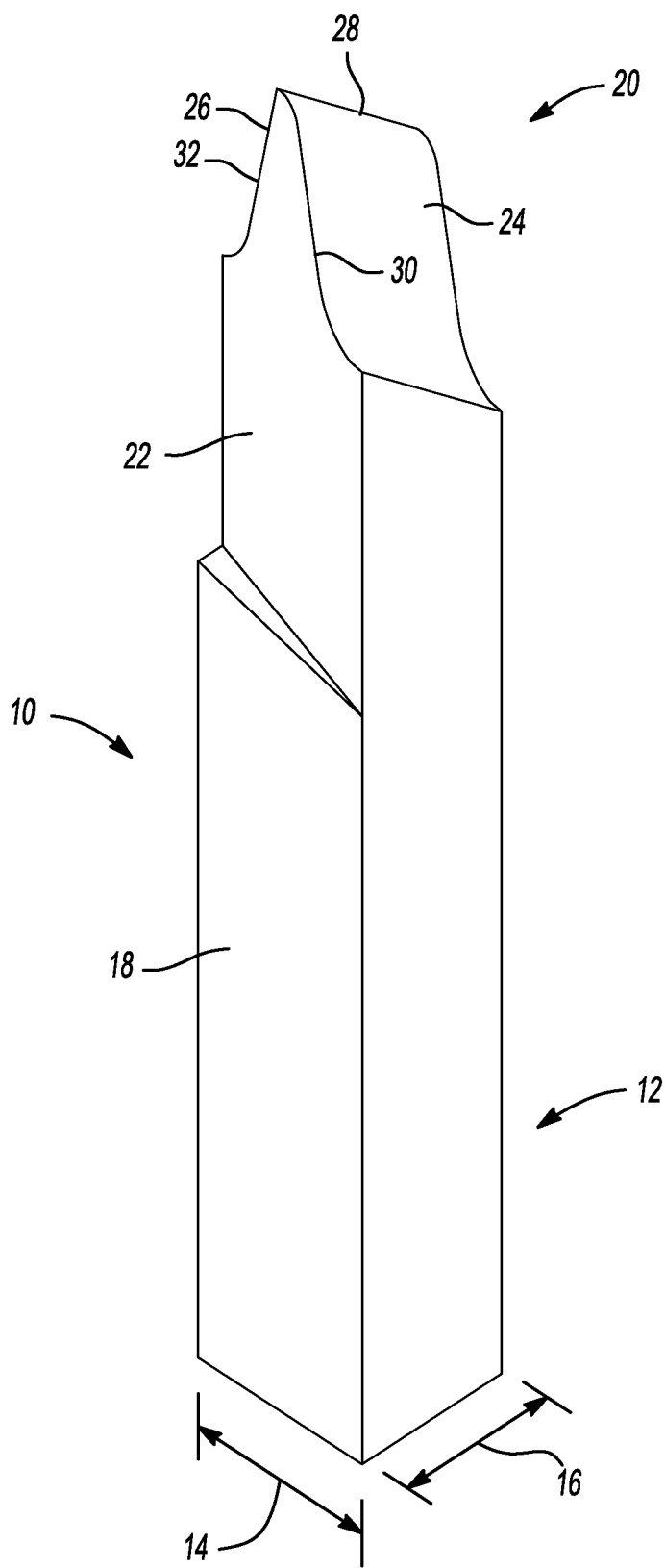
FIG. 1 is perspective view of an exemplary cutting tool.

FIG. 1 depicts an exemplary cutting tool 10 operable to remove material from a gear blank and form a portion of the gear teeth. Typically, cutting tools are arranged in pairs where the first tool of the pair removes material from one side of the "V-shaped" groove and the other tool having an opposite hand removes material from the opposite side of the same "V-shaped" groove. Depending on the gear to be manufactured, many pairs of cutting tools may be mounted to a cutting head (not shown) to form a gear.

Cutting tool 10 is formed from an elongated bar of tungsten carbide having a rectangular cross-section. Cutting tool 10 includes a gripping portion 12 having a width 14 and height 16. Gripping portion 12 maintains a substantially rectangular cross-section. Gripping portion 12 includes a top face 18. A cutting tip 20 is formed at an opposite end of cutting tool 10 from gripping portion 12. Cutting tip 20 is formed by machining a cutting face 22 at a 12° angle to top face 18. Cutting tip 20 includes a first side 24 and a second side 26. The first and second sides terminate at a rounded root cutting portion 28. The intersection of cutting face 22 and first side 24 forms a cutting edge 30 operable to remove material from the gear blank. Second side 26 is shaped to provide clearance for the opposite hand cutting element (not shown) paired with cutting tool 10. An edge 32 formed at the intersection of cutting face 22 and second side 26 does not typically remove any material from the gear blank.

As previously described, after a number of gears have been cut, cutting edge 30 dulls. At this time, cutting tool 10 is removed from the gear cutting apparatus and sharpened. During sharpening, the cutting tool is ground along first side 24, second side 26 and rounded root cutting portion 28. The grinding forms a sharpened cutting edge 30. After cutting tool 10 has been sharpened, first side 24, second side 26 and rounded root cutting portion 28 will no longer be coated by the previously deposited wear resistant coating. Accordingly, sharpened cutting tools are prepared to be exposed to an environment within an enclosed chamber (not shown) to coat cutting edge 30, first side 24, second side 26 and rounded root cutting portion 28 with the wear resistant material.

Figure 2:
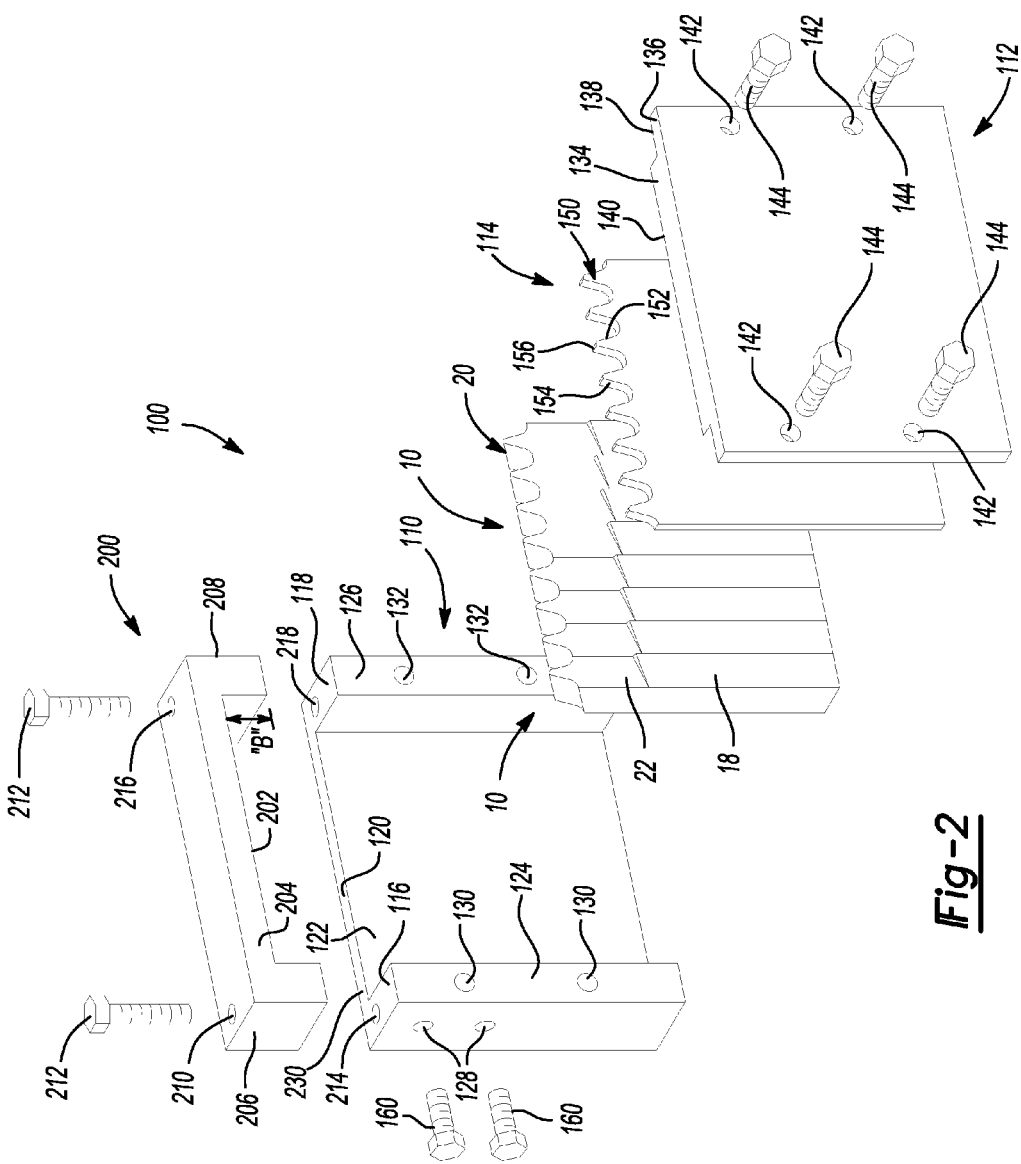
FIG. 2 is an exploded perspective view of a fixture operable to hold and mask cutting tools during a coating process.
Figure 3:
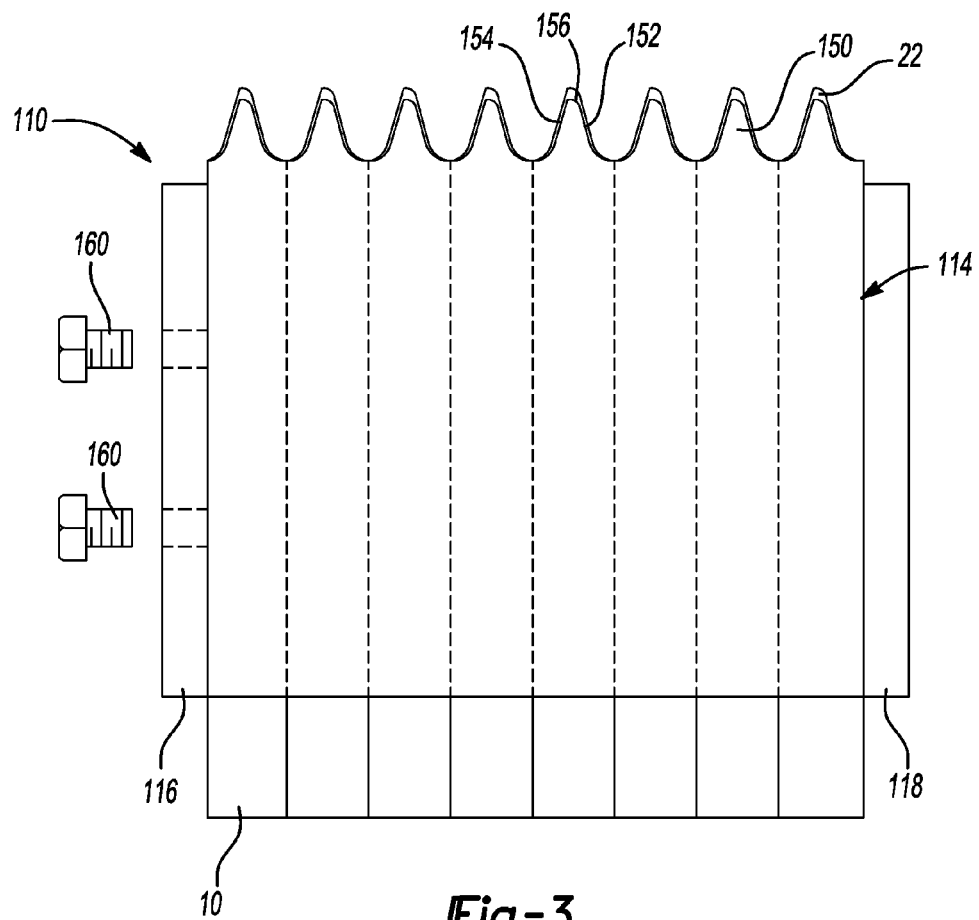
FIG. 3 is a top view of a portion of the fixture illustrated in FIG. 2 having a plurality of cutting tools positioned therein.

After sharpening, cutting tool 10 is thoroughly cleaned to remove any dirt, oil or metal shavings from the surfaces of the cutting tool 10. A single sharpened cutting tool 10 or a number of sharpened cutting tools similar to cutting tool 10 are next placed in a fixture 100 illustrated in FIGS. 2-4. Fixture 100 is operable to accurately align a number of cutting tools relative to one another and mask a majority of the external surfaces of the cutting tools from exposure to an environment containing a wear resistant coating. Fixture 100 is sized to support the cutting tools 10 in the enclosed chamber having a mixture of gases and titanium aluminum nitride and/or titanium nitride coating circulating throughout the chamber. The surfaces exposed to the environment within the chamber are coated with a predetermined thickness of wear resistant material based on the time of exposure to the environment in the chamber.

Figure 5:
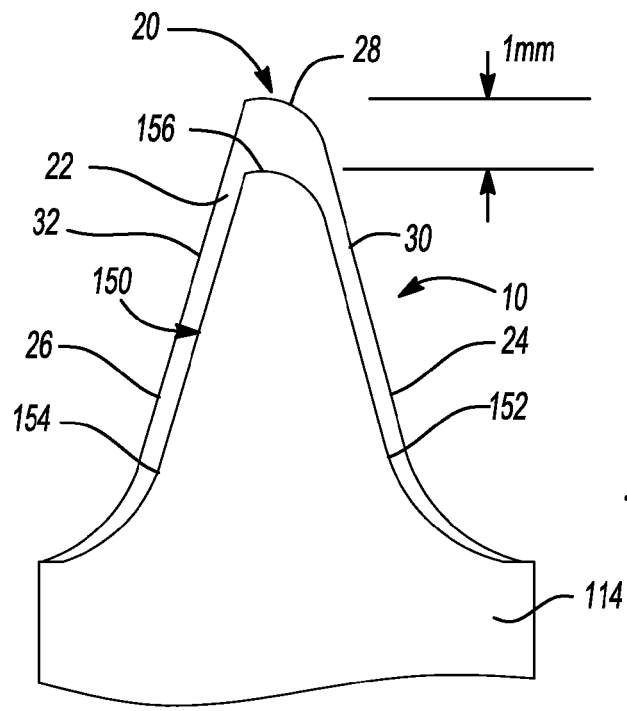
FIG. 5 is a partial fragmentary plan view of a portion of a cutting tool and a portion of a mask positioned on the cutting tool.

To assure that less than five thicknesses of wear resistant coating are present on cutting tip 20 at any one time, fixture 100 is sized and shaped to expose only a very limited portion of each cutting tool 10 to the environment within the chamber. Specifically, the surface of the portion of cutting tool 10 that is exposed to the environment approximately corresponds to the portion of cutting tool 10 that would be removed when cutting tool 10 is resharpened. FIG. 5 depicts the amount of cutting face 22 exposed after mounting and masking the cutting tools 10 within fixture 100. In this manner, only one or two thicknesses of wear resistant coating are on cutting edge 30 at any one time. By maintaining a proper thickness of wear resistant coating, tool life is greatly extended.

Fixture 100 includes a shell 110, a cover 112 and a mask 114. Shell 110 is a substantially "U" shaped member having a first side wall 116, a second side wall 118 and an end wall 120 interconnecting the side walls. End wall 120 includes a substantially planar top surface 122 extending between first side wall 116 and second side wall 118. First side wall 116 includes a substantially planar upper surface 124. Second side wall 118 includes a substantially planar upper surface 126. Upper surface 124 and upper surface 126 are substantially co-planar with one another. Threaded apertures 128 extend transversely through first side wall 116. Threaded bores 130 are positioned in first side wall 116 and extend through upper surface 124. Threaded bores 132 are positioned within second side wall 118. Bores 132 extend through upper surface 126 of second side wall 118.

Cover 112 is substantially shaped as a plate having a hat-shaped cross-section. Cover 112 includes a body portion 134 and laterally extending flanges 136. Flanges 136 include lower surfaces 138. Body portion 134 includes a lower surface 140. Apertures 142 extend through the thickness of cover 112. Apertures 142 are sized and positioned to receive threaded fasteners 144. Threaded fasteners 144 threadingly engage bores 130 and bores 132 formed in shell 110. Fasteners 144 are operable to clamp cutting tools 10 and mask 114 between top surface 122 of end wall 120 and bottom surface 140 of cover 112.

Figure 4:
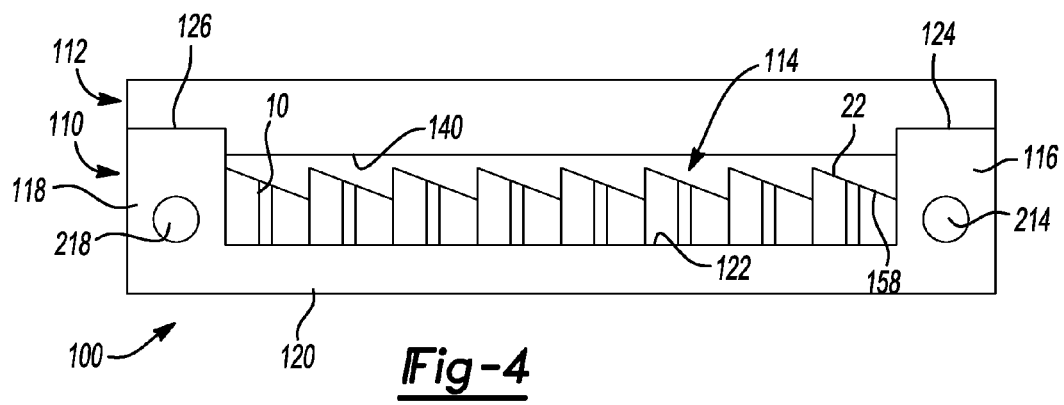
FIG. 4 is an end view of the fixture illustrated in FIG. 2 having a plurality of cutting tools positioned therein.

Mask 114 is a plate-like structure having a plurality of teeth 150 formed at one end. Each tooth 150 includes a first face 152 and a second face 154 interconnected by a rounded end 156. First face 152, second face 154 and rounded end 156 are shaped substantially similarly to first side 24, second side 26 and rounded root cutting portion 28 of cutting tip 20. Furthermore, each tooth 150 is spaced apart a distance equivalent to the spacing between adjacent cutting tips 20 of cutting tools 10 when positioned adjacent to one another. As best illustrated in FIG. 4, each tooth 150 includes an angled back face 158 positioned to engage one of the cutting faces 22 formed on each cutting tool 10.

After the individual cutting tools 10 have been sharpened, a number of cutting tools are positioned within shell 110. Cutting tips 20 are aligned along a common plane and then cutting tools 10 are mounted to shell 110 using a pair of threaded fasteners 160. Threaded fasteners 160 are threadingly engaged with apertures 128 and protrude through first side wall 116 to engage one of the cutting tools positioned within shell 110. A compressive load is placed on each of the cutting tools via threaded fasteners 160 to secure the cutting tools within the shell.

One skilled in the art will appreciate that any number of manufacturing techniques may be used to align cutting tips 20 along the common plane. For example, a cap 200 may be temporarily coupled to shell 110 to provide a datum surface 202 on which each of the cutting tools are abutted prior to clamping cutting tools 10 to shell 110. Specifically, cap 200 is a substantially "C" shaped member having a wall 204 interconnecting a first leg 206 and a second leg 208. First leg 206 includes an aperture 210 extending therethrough for receipt of a fastener 212. Fastener 212 is threadingly engageable with an aperture 214 formed in first side wall 116. Similarly, second leg 208 includes an aperture 216 for receipt of another fastener 212 threadingly engaged with an aperture 218 formed in second side wall 118. Datum surface 202 is formed on wall 204 and spaced apart a predetermined distance "B" from an end surface 230 of shell 110.

Cap 200 may also be used to properly position mask 114 relative to the cutting tools 10. Alternatively, mask 114 may include a key or a pin (not shown) to align mask 114 relative to shell 110 at a predetermined location. Because teeth 150 of mask 114 are similarly shaped to cutting tips 20 of cutting tool 10, mask 114 is axially offset from the plurality of cutting tools 10 such that teeth 150 formed on mask 114 do not completely cover the entire cutting face 22 of each cutting tool 10. As illustrated in FIG. 5, rounded end 156 is offset from rounded root cutting portion 28 by a predetermined distance. In the example shown, the predetermined distance is 1 mm. It should be appreciated that this distance may vary depending on the amount of cutting tool that must be removed during each grinding or sharpening process. Furthermore, because rounded end 156 is offset from rounded root cutting portion 28, a portion of cutting face 22 adjacent cutting edge 30 and edge 32 is exposed to atmosphere. Based on the orientation of the components previously described, each cutting tool 10 will receive a coating of wear resistant material on first side 24, second side 26, rounded root cutting portion 28, cutting edge 30, edge 32 and a relatively small portion of cutting face 22.

Once the positioning of cutting tool 10 and mask 114 is completed, fasteners 144 interconnect cover 112 and shell 110 to clamp cutting tools 10 and mask 114 therebetween. The subassembly of cutting tools and fixture 100 are placed within an enclosed vessel and the portions of each of the cutting tools 10 exposed to atmosphere are coated with a predetermined thickness of wear resistant material.

Upon completion of the sharpening and coating processes, the cutting tools are mounted to a cutting head and used to manufacture gears once again. Once the cutting tools 10 are dull, the tools are removed and the sharpening and coating processes are repeated. It should be appreciated that the external surfaces of cutting tools 10 that were previously coated are now removed during the sharpening process. Therefore, an undesirable amount of wear resistant coating is not accumulated at any time through tool life.

Figure 6:
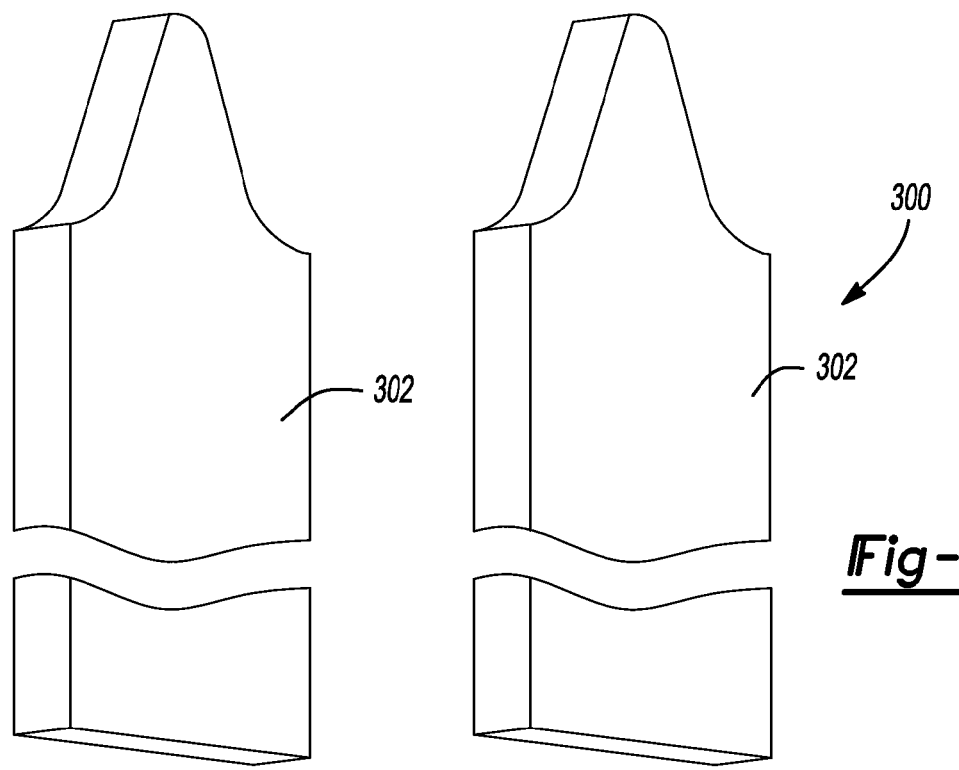
FIG. 6 is an exploded perspective fragmentary view illustrating alternate embodiment masks.

An alternate embodiment mask assembly 300 is depicted at FIG. 6. A plurality of masks 302 are used in conjunction with shell 110. Each mask 302 is shaped substantially similar to the cutting end of a cutting tool 10. Each mask 302 is positioned substantially similarly as teeth 150 were positioned relative to cutting tips 20 in the previous embodiment. It is contemplated that masks 302 may be used in place of mask 114 and vice versa.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for forming a sharpened cutting tool from an intermediate cutting tool, the intermediate cutting tool having a ground cutting tip that comprises a planar face and a sharpened cutting edge at a distal end of the planar face, the ground cutting tip being relieved on a side and an end that cooperate with the planar face to define the sharpened cutting edge, the method comprising:
    masking the intermediate cutting tool such that a first predetermined portion of the planar face is exposed and a second predetermined portion of the planar face is not exposed, the exposed portion of the planar face including the sharpened cutting edge and including at least portions of the end and the side that cooperate to define the cutting edge; and
    depositing a wear-resistant material onto the exposed portion of the planar face of the intermediate cutting tool to form the sharpened cutting tool.

2. The method of claim 1, wherein the first predetermined portion has a length of about 1 mm.

3. The method of claim 1, wherein masking the intermediate cutting tool comprises securing the intermediate cutting tool into a fixture.

4. The method of claim 3, wherein the intermediate cutting tool is secured into the fixture with a plurality of other intermediate cutting tools.

5. The method of claim 1, wherein the wear-resistant material is selected from a group consisting of titanium aluminum nitride, titanium nitride and combinations thereof.

6. The method of claim 1, further comprising repeating the masking and depositing steps at least two times and wherein no portion of any cutting tip of any sharpened cutting tool has had the wear-resistant material deposited onto it more than twice.

7. The method of claim 1, further comprising repeating the masking and depositing steps at least two times and wherein no portion of any cutting tip of any sharpened cutting tool includes more than two layers of the wear-resistant material.

8. A method for forming a sharpened cutting tool from an intermediate cutting tool, the intermediate cutting tool having a ground cutting tip that comprises a planar face and a sharpened cutting edge at a distal end of the planar face, the ground cutting tip being relieved on a side and an end that cooperate with the planar face to define the sharpened cutting edge, the method comprising:
    depositing a wear-resistant material onto the intermediate cutting tool such that the wear resistant material that is deposited onto the intermediate cutting tool is deposited on a first predetermined portion of the planar face and is not deposited on a second predetermined portion of the planar face, the second predetermined portion being spaced apart from the sharpened cutting edge.

9. The method of claim 8, wherein a mask is applied to the intermediate cutting tool prior to the deposition of the wear-resistant material.

10. The method of 9, wherein the mask comprises an assembly into which the intermediate cutting tool is secured.

11. The method of claim 10, further comprising aligning the intermediate cutting tool to a predetermined datum relative to the assembly.

12. The method of claim 9, further comprising repeating the masking and depositing steps at least two times and wherein no portion of any cutting tip of any sharpened cutting tool has had the wear-resistant material deposited onto it more than twice.

13. The method of claim 8, further comprising repeating the masking and depositing steps at least two times and wherein no portion of any cutting tip of any sharpened cutting tool includes more than two layers of the wear-resistant material.

14. The method of claim 8, wherein the first predetermined portion has a length of about 1 mm.

15. A method for forming a sharpened cutting tool from an intermediate cutting tool, the intermediate cutting tool having a sharpened cutting edge that is defined by a planar face, a side face and an end face, the sharpened cutting tool comprising a right parallelepiped body and a cutting tip, the cutting tip comprising the sharpened cutting edge and a wear-resistant coating deposited thereon, the method comprising:
    masking the intermediate cutting tool such that a first predetermined portion of the planar face is exposed and a second predetermined portion of the planar face is not exposed, the second predetermined portion of the planar face being spaced apart from the sharpened cutting edge; and
    depositing a wear-resistant material onto the exposed portion of the planar face of the intermediate cutting tool to form the sharpened cutting tool such that the wear-resistant material is disposed between the sharpened cutting edge and an unexposed portion of the planar face, the wear-resistant material being selected from a group consisting of titanium aluminum nitride, titanium nitride and combinations thereof.

\* \* \* \* \*